United States Patent [19]
Gopalakrishnan et al.

[11] Patent Number: 4,929,594
[45] Date of Patent: May 29, 1990

[54] SUPERCONDUCTING COMPOSITION $Tl_2Ba_2CuO_{6+x}$ AND PROCESS FOR MANUFACTURE

[75] Inventors: Jagannatha Gopalakrishnan, Wilmington; Munirpallam A. Subramanian, New Castle, both of Del.

[73] Assignee: E. I. Du Pont de Nemours and Company, Wilmington, Del.

[21] Appl. No.: 167,616

[22] Filed: Mar. 14, 1988

[51] Int. Cl.$^5$ .................... C01F 11/02; C01G 3/02; C01G 15/00; H01L 39/12
[52] U.S. Cl. .................................. 505/1; 252/521; 423/604; 423/624; 501/123; 502/346; 505/775; 505/783
[58] Field of Search ................... 501/123; 502/346; 423/604, 624, 635; 252/521; 505/1

[56] References Cited
PUBLICATIONS

Dagan, R.; "New Class of Superconductors Pushing Temp. Higher", *Chemical & Engineering News,* May 16, 1988, pp. 24–29.
Bednorz and Muller, Z. Phys. B64, 189, (1986).
Wu. et al., Phys. Rev. Lett. 58, 908, (1987), Mar. 2.
C. Michael et al., Z. Phys. B—Condensed Matter 68, 421, (1987).
H. Maeda et al., Jpn. J. Appl. Phys. 27, L209, (1988), Feb.
R. M. Hazen et al., Phys. Rev. Lett in press, Apl. 18.
Z. Z. Sheng et al., Nature 332, 55, (1988).
Shent et al., Physical Review Letters, 60, 937–940, (1988).

*Primary Examiner*—Paul Lieberman
*Assistant Examiner*—John Boyd

[57] ABSTRACT

Compositions containing a crystalline phase of the formula $Tl_2Ba_2CuO_{6+x}$ wherein x is from 0 to 0.5. Processes for manufacturing such compositions and for using them are disclosed.

2 Claims, No Drawings

SUPERCONDUCTING COMPOSITION TL$_2$BA$_2$CUO$_{6+x}$ AND PROCESS FOR MANUFACTURE

BACKGROUND OF THE INVENTION

FIELD OF THE INVENTION

This invention relates to a superconducting composition comprised of a crystalline metal oxide phase in the Tl—Ba—Cu—O system and to a process to produce the composition.

REFERENCES

Bednorz and Muller, Z. Phys. B64, 189 (1986), disclose a superconducting phase in the La—Ba—Cu—O system with a superconducting transition temperature of about 35 K. This disclosure was subsequently confirmed by a number of investigators [see, for example, Rao and Ganguly, Current Science, 56, 47 (1987), Chu et al., Science 235, 567 (1987), Chu et al., Phys. Rev. Lett. 58, 405 (1987), Cava et al., Phys. Rev. Lett. 58, 408 (1987), Bednorz et al., Europhys. Lett. 3, 379 (1987)]. The superconducting phase has been identified as the composition La$_{1-x}$(Ba,Sr,Ca)$_x$CuO$_{4-y}$ with the tetragonal K$_2$NiF$_4$-type structure and with x typically about 0.15 and y indicating oxygen vacancies.

Wu et al., Phys. Rev. Lett. 58, 908 (1987), disclose a superconducting phase in the Y—Ba—Cu—O system with a superconducting transition temperature of about 90 K. Cava et al., Phys. Rev. Lett. 58, 1676 (1987), have identified this superconducting Y—Ba—Cu—O phase to be orthorhombic, distorted, oxygen-deficient perovskite YBa$_2$Cu$_3$O$_{9-\delta}$ where $\delta$ is about 2.1 and present the powder x-ray diffraction pattern and lattice parameters.

C. Michel et al., Z. Phys. B - Condensed Matter 68, 421 (1987), disclose a novel family of superconducting oxides in the Bi—Sr—Cu—O system with composition close to Bi$_2$Sr$_2$Cu$_2$O$_{7+\delta}$. A pure phase was isolated for the composition Bi$_2$Sr$_2$Cu$_2$O$_{7+\delta}$. The X-ray diffraction pattern for this material exhibits some similarity with that of perovskite and the electron diffraction pattern shows the perovskite subcell with the orthorhombic cell parameters of a=5.32 Å (0.532 nm), b=26.6 Å (2.66 nm) and c=48.8 Å (4.88 nm). The material made from ultrapure oxides has a superconducting transition with a midpoint of 22 K as determined from resistivity measurements and zero resistance below 14 K. The material made from commercial grade oxides has a superconducting transition with a midpoint of 7 K.

H. Maeda et al., Jpn. J. Appl. Phys. 27, L209 (1988), disclose a superconducting oxide in the Bi—Sr—Ca—Cu—O system with the composition near BiSrCaCu$_2$Ox and a superconducting transition temperature of about 105 K.

The commonly assigned applications, "Superconducting Metal Oxide Compositions and Process For Making Them", S.N. 153,107, filed Feb. 8, 1988, and S.N. 152,186, filed Feb. 4, 1988, both filed in the names of Gopalakrishnan, Sleight and Subramanian, disclose superconducting compositions having the nominal formula Bi$_a$Sr$_b$Ca$_c$Cu$_3$O$_x$ wherein a is from about 1 to about 3, b is from about ⅜ to about 4, c is from about 3/16 to about 2 and $x=(1.5 a+b+c+y)$ where y is from about 2 to about 5, with the proviso that b+c is from about 3/2 to about 5, said compositions having superconducting transition temperatures of about 70 K or higher. It also discloses the superconducting metal oxide phase having the formula Bi$_2$Sr$_{3-z}$Ca$_z$Cu$_2$O$_{8+w}$ wherein z is from about 0.1 to about 0.9, preferably 0.4 to 0.8 and w is greater than zero but less than about 1. M. A. Subramanian et al., Science 239, 1015 (1988) also disclose the Bi$_2$Sr$_{3-z}$Ca$_z$Cu$_2$O$_{8+w}$ superconductor.

R. M. Hazen et al., Phys. Rev. Lett. in press, disclose two superconducting phases in the Tl—Ba—Ca—Cu—O system, Tl$_2$Ba$_2$Ca$_2$Cu$_3$O$_{10}$ and Tl$_2$Ba$_2$CaCu$_2$O$_8$.

Z. Z. Sheng et al., Nature 332, 55 (1988) disclose superconductivity in the Tl—Ba—Cu—O system in samples which have nominal compositions Tl$_2$Ba$_2$Cu$_3$O$_{8+x}$ and TlBaCu$_3$O$_{5.5+x}$. Both samples are reported to have onset temperatures above 90 K and zero resistance at 81 K. The samples were prepared by mixing and grinding appropriate amounts of BaCO$_3$ and CuO with an agate mortar and pestle. This mixture was heated in air at 925 °C. for more than 24 hours with several intermediate grindings to obtain a uniform black oxide Ba—Cu oxide powder which was mixed with an appropriate amount of Tl$_2$O$_3$, completely ground and pressed into a pellet with a diameter of 7 mm and a thickness of 1-2 mm. The pellet was then put into a tube furnace which had been heated to 880° C.-910° C. and was heated for 2-5 minutes in flowing oxygen. As soon as it had slightly melted, the sample was taken from the furnace and quenched in air to room temperature. It was noted by visual inspection that Tl$_2$O$_3$ had partially volatilized as black smoke, part had become a light yellow liquid, and part had reacted with. Ba—Cu oxide forming a black, partially melted, porous material.

SUMMARY OF THE INVENTION

This invention provides novel superconducting compositions comprised of a crystalline phase with the formula Tl$_2$Ba$_2$CuO$_{6+x}$ wherein x is from 0 to about 0.5; said phase having an onset of superconductivity at a temperature above 90 K.

This invention also provides a novel process for preparing these compositions containing this crystalline phase and, more specifically, for making single crystals of this phase. The process consists essentially of the steps: of mixing quantities of Tl$_2$O$_3$, BaO$_2$ and CuO selected with the atomic ratio of Tl:Ba:Cu of a:b:1, wherein a and b are each about ½-2, placing the mixture in a sealed tube and heating the mixture in the tube at about 850° C. to about 900° C. for about 3 to about 12 hours. This process produces substantially a single phase having the formula Tl$_2$Ba$_2$CuO$_{6+x}$, when the quantities of oxide reactants, Tl$_2$O$_3$, BaO$_2$ and CuO, are chosen such that a and b are each equal to 2. To produce larger single crystals of the phase, in contrast to crystalline powders, it is preferable to chose the quantities of oxide reactants such that a and b are each less than 2.

DETAILED DESCRIPTION OF THE INVENTION

The superconducting compositions of this invention comprises a crystalline phase with the formula Tl$_2$Ba$_2$CuO$_{6+x}$ wherein x is from 0 to about 0.5.

The superconducting composition can be prepared by the following process. Quantities of the oxide reactants Tl$_2$O$_3$, BaO$_2$ and CuO are chosen with the atomic ratio of Tl:Ba:Cu of a:b:1, wherein a and b are each about ½-2, and are mixed, for example, by grinding them together in a mortar. The mixed powder may then be heated directly or it can be first formed into a pellet or other shaped object and then heated. The crystalline phase of this invention is produced only when the atmosphere in which the reactants are heated is carefully controlled. One way to control the atmosphere is to place the reactants in a tube made of a non-reacting metal such as gold and then seal the tube by welding it shut. The sealed tube is then placed in a furnace and heated at about 850° C. to about 900° C. for about 3 to about 12 hours. The power to the furnace is then turned off and the tube is permitted to cool in the furnace to ambient temperature, about 20° C. The tube is then removed from the furnace and opened and the product comprised of the black crystalline phase recovered. The compositions prepared in this manner exhibit the onset of superconductivity above 90 K.

In order to produce a composition of this invention that is substantially single phase it is desirable to react quantities of the oxide reactants $Tl_2O_3$, $BaO_2$ and $CuO$ chosen with the atomic ratio of Tl:Ba:Cu of 2:2:1. The composition has less material of phases other than $Tl_2Ba_2CuO_{6+x}$ as the ratio of Tl:Ba:Cu nears the stoichiometric ratio 2:2:1.

In order to produce single crystals with at least 2 dimensions greater than a millimeter it is desirable to have excess CuO present and it is therefore desirable to have a and b as defined above in connection with the Tl:Ba:Cu ratio to be each less than 2.

Superconductivity can be confirmed by observing magnetic flux exclusion, i.e., the Meissner effect. This effect can be measured by the method described in an article by E. Polturak and B. Fisher in Physical Review B, 36, 5586(1987).

The superconducting compositions of this invention can be used to conduct current extremely efficiently or to provide a magnetic field for magnetic imaging for medical purposes. Thus, by cooling the composition in the form of a wire or bar to a temperature below the superconducting transition temperature, e.g., at or below about 90 K, by exposing the material to liquid nitrogen or liquid helium in a manner well known to those in this field; and initiating a flow of electrical current, one can obtain such flow without any electrical resistive losses. To provide exceptionally high magnetic fields with minimal power losses, the wire mentioned previously could be wound to form a coil which would be exposed to liquid nitrogen or helium before inducing any current into the coil. The superconducting compositions of this invention can also be used to provide diamagnetic fields. Such fields are obtained by exposing the compositions in the form of a sheet or similar construction to an external magnetic field, the sheet being cooled to a temperature below the superconducting transition temperature. Such fields can be used to levitate objects as large as railroad cars. These superconducting compositions are also useful in Josephson devices such as SQUIDS (superconducting quantum interference devices) and in instruments that are based on the Josephson effect such as high speed sampling circuits and voltage standards.

EXAMPLES OF THE INVENTION

EXAMPLE 1

4.5674 g of $Tl_2O_3$, 3.3868 g of $BaO_2$ and 1.5908 g CuO, corresponding to a Tl:Ba:Cu ratio of 1:1:1, were ground together in an agate mortar for 30 min. Pellets, 10 mm in diameter and about 3 mm thick, were pressed from this mixed powder. Two pellets were loaded in a gold tube (⅜" dia and 5" length) and the tube was sealed by welding the ends. The tube was placed in a furnace and heated at a rate of 10° C. per minute to 900° C. and then held at 900° C. for 9 hours. Power to the furnace was then shut off and the tube was allowed to cool to room temperature in the furnace. The tube was then removed from the furnace and cut open. Black shiny crystals with plate-like morphology were recovered.

Single crystal X-ray diffraction results carried out on a platelet together with the fact that this phase is superconducting indicates that this superconducting phase has the formula $Tl_2Ba_2CuO_{6+x}$; wherein x is from 0 to about 0.5.

The d-spacings, the relative intensities and the indices of the observed reflections of the X-ray powder diffraction pattern of the product are shown in Table I. Most of the lines can be indexed on a tetragonal cell with cell constants a=3.865 Å (0.3865 nm) and c=23.234 Å (2.3234 nm).

Meissner effect measurements showed the onset of superconductivity at about 90 K.

TABLE I

| d-spacing, Å | Intensity | hkl |
|---|---|---|
| 11.4477 | W | 002 |
| 5.7739 | W | 004 |
| 3.8637 | W | 006 |
| 3.4567 | W | 103 |
| 2.9664 | S | 105 |
| 2.8968 | S | 008 |
| 2.7341 | M | 110 |
| 2.6574 | VW | 112 |
| 2.3191 | VS | 0010 |
| 1.9874 | VW | 118 |
| 1.9307 | VW | 200,0012 |
| 1.7694 | M | 1110 |
| 1.6573 | M | 0014 |
| 1.6204 | M | 215 |

W - weak
M - moderate
S - strong

EXAMPLE 2

4.5674 g of $Tl_2O_3$, 3.3868 g of $BaO_2$ and 2.3862 g CuO, corresponding to a Tl:Ba:Cu ratio of 2:2:3, were ground together in an agate mortar for 30 min. Pellets, 10 mm in diameter and about 3 mm thick, were pressed from this mixed powder. Two pellets were loaded in a gold tube (⅜" diameter and 5" length) and the tube was sealed by welding the ends. The tube was placed in a furnace and heated at a rate of 10° C. per minute to 900° C. and then held at 900° C. for 9 hours. Power to the furnace was then shut off and the tube was allowed to cool to room temperature in the furnace. The tube was then removed from the furnace and cut open. Black shiny plates of crystals were recovered.

The X-ray powder diffraction pattern of the product is essentially the same as that shown in Table I.

Meissner effect measurements showed the onset of superconductivity at about 90 K.

EXAMPLE 3

6.8511 g of $Tl_2O_3$, 3.3868 g of $BaO_2$ and 3.1816 g CuO, corresponding to a Tl:Ba:Cu ratio of 3:2:4, were ground together in an agate mortar for 30 min. Pellets, 10 mm in diameter and about 3 mm thick, were pressed from this mixed powder. Two pellets were loaded in a gold tube (⅜" diameter and 5" length) and the tube was sealed by welding the ends. The tube was placed in a furnace and heated at a rate of 10° C. per minute to 900° C. and then held at 900° C. for 9 hours. Power to the furnace was then shut off and the tube was allowed to cool to room temperature in the furnace. The tube was then removed from the furnace and cut open. Black shiny plates of crystals were recovered.

The X-ray powder diffraction pattern of the product is essentially the same as that shown in Table I.

Meissner effect measurements showed the onset of superconductivity at about 90 K.

EXAMPLE 4

18.2696 g of $Tl_2O_3$, 13.5472 g of $BaO_2$ and 3.1816 g CuO, corresponding to a Tl:Ba:Cu ratio of 2:2:1, were mixed in a ball mill for 45 minutes. Pellets, 10 mm in diameter and about 3 mm thick, were pressed from this mixed powder. Two pellets were loaded in a gold tube ($\frac{3}{8}$" diameter and 5" length) and the tube was sealed by welding the ends. The tube was placed in a furnace and heated at a rate of 5° C. per minute to 875° C. and then held at 875° C. for 3 hours. Power to the furnace was then shut off and the tube was allowed to cool at room temperature in the furnace and cut open. Black shiny crystalline product was recovered.

The X-ray powder diffraction pattern of the product showed that the product is substantially single phase. The X-ray powder diffraction pattern is essentially the same as that shown in Table I and can be indexed on a tetragonal (or pseudotetragonal) cell with cell constants a=3.866 Å (0.3866 nm) and c=23.25 Å (2.325 nm). This result provides further confirmation that the superconducting phase has the formula $Tl_2Ba_2CuO_{6+x}$.

Meissner effect measurements showed the onset of superconductivity at about 90 K.

The Invention Being Claimed Is:

1. Single phase crystalline metal oxide having the formula $Tl_2Ba_2CuO_{6+x}$ wherein x is from 0 to about 0.5.

2. The single phase crystalline metal oxide of claim 1 having the following X-ray diffraction powder pattern:

| d-spacing, Å | Intensity | hkl |
|---|---|---|
| 11.4477 | W | 002 |
| 5.7739 | W | 004 |
| 3.8637 | W | 006 |
| 3.4567 | W | 103 |
| 2.9664 | S | 105 |
| 2.8968 | S | 008 |
| 2.7341 | M | 110 |
| 2.6574 | VW | 112 |
| 2.3191 | VS | 0010 |
| 1.9874 | VW | 118 |
| 1.9307 | VW | 200,0012 |
| 1.7694 | M | 1110 |
| 1.6573 | M | 0014 |
| 1.6204 | M | 215 |

W - weak
M - moderate
S - strong

* * * * *